United States Patent [19]

Christensen et al.

[11] 3,900,325

[45] Aug. 19, 1975

[54] LIGHT SENSITIVE QUINONE DIAZIDE COMPOSITION WITH N-3-OXOHYDROCARBON SUBSTITUTED ACRYLAMIDE

[75] Inventors: Carl W. Christensen; Calvin M. Isaacson, both of Beverly, Mass.

[73] Assignee: Shipley Company, Inc., Newton, Mass.

[22] Filed: Nov. 6, 1972

[21] Appl. No.: 304,111

Related U.S. Application Data

[63] Continuation-in-part of Ser. No. 261,982, June 12, 1972, abandoned.

[52] U.S. Cl. ........................ 96/91 D; 96/36; 96/36.2; 96/75; 96/115 R

[51] Int. Cl. ........................ G03f 7/08; G03c 1/54

[58] Field of Search .......... 96/91 D, 91 R, 91 N, 75, 96/115 R, 115 P, 114, 36.2, 114.5, 114.6, 33, 36.3, 36

[56] References Cited

UNITED STATES PATENTS

| | | | |
|---|---|---|---|
| 2,687,958 | 8/1954 | Neugebauer | 96/91 R |
| 3,081,168 | 3/1963 | Leekley et al. | 96/115 R |
| 3,085,008 | 4/1963 | Case | 96/33 |
| 3,277,056 | 10/1966 | Coleman | 260/67 UA |
| 3,495,979 | 2/1970 | Laridon et al. | 96/91 D |
| 3,533,796 | 10/1970 | Lassig et al. | 96/91 D |
| 3,551,154 | 12/1970 | Di Blas et al. | 96/91 D |
| 3,592,646 | 7/1971 | Holstead et al. | 96/91 D |
| 3,616,370 | 10/1971 | Jennings | 204/159.15 |
| 3,637,384 | 1/1972 | Deutsch et al. | 96/91 D |
| 3,715,210 | 2/1973 | Watkinson | 96/91 D |
| 3,725,231 | 4/1973 | Jahnke | 96/115 P |
| 3,737,319 | 6/1973 | Borden | 96/115 R |
| 3,794,494 | 2/1974 | Kai et al. | 96/115 P |

FOREIGN PATENTS OR APPLICATIONS

| | | | |
|---|---|---|---|
| 1,243,968 | 8/1971 | United Kingdom | 96/91 D |
| 852,496 | 10/1960 | United Kingdom | 96/91 D |

*Primary Examiner*—Charles L. Bowers, Jr.
*Attorney, Agent, or Firm*—Robert L. Goldberg

[57] ABSTRACT

This invention is for a positive working, light sensitive composition useful for diverse applications such as metal plating and etching of metal, ceramics and the like, in a pattern, for example, in chemical milling or in the manufacture of printed circuit boards. Light sensitive compositions of the invention comprise (1) a major portion of a resin system having as principal ingredients, a carboxyl type acrylic resin and an acrylamide as a modifier and (2) a minor portion of at least one positive working, light sensitive diazo compound. By use of the acrylamide modifier in combination with the acrylic resin, there is provided a thick resist coating having improved photochemical properties and improved chemical resistance, especially to acid.

9 Claims, No Drawings

LIGHT SENSITIVE QUINONE DIAZIDE COMPOSITION WITH N-3-OXOHYDROCARBON SUBSTITUTED ACRYLAMIDE

CROSS REFERENCE TO RELATED APPLICATIONS

This application is a continuation-in-part of U.S. patent application Ser. No. 261,982, filed June 12, 1972, now abandoned.

BACKGROUND OF THE INVENTION

1. Field of the Invention

This invention relates to a positive working light sensitive diazo composition and more particularly, to a light sensitive composition cocmprising a diazo compound in combination with a resin system comprising an acrylic resin and an acrylamide.

2. Description of the Prior Art

As is known in the art, photosensitive resists are thin coatings (typically less than ½ mil) produced from solution which when exposed to light of the propr wavelength, are chemically changed in their solubility to certain solvents (developers). Two types are available, negative and positive acting. The negative acting resist is initially a mixture which is soluble in its developer, but after light exposure, becomes insoluble in developer. Exposure is done through a film pattern. The unexposed resist is selectively dissolved, softened or washed away leaving a desired resist pattern on a laminate. Positive acting resists work in the opposite fashion, light exposure making the resist soluble in the developer. The resist image may be dyed to make it visible for inspection and touching. The resist pattern that remains after development (and post-baking in some cases), is insoluble and chemically resistant to the solution used in conjuction with the photoresist.

The production of printed circuit boards by a process involving the formation of a coating of a photoresist is known. In one process, a metal clad base sheet is coated with photoresist and exposed with the negative of the desired image. The negative areas of the resist are made soluble in a developer by exposure to light, and are washed with the developer to leave the underneath metal layer exposed. An etchant to which the resist is impervious is used to etch away the exposed metal, and there remains a layer of metal in the desired image pattern.

Typical examples of photosensitive materials used for resist formulations include vinyl cinnamate copolymers, and cinnamate quaternary salts, and various diazo compounds as disclosed in U.S. Pat. Nos. 3,046,118; 3,106,465; and 3,148,983.

Because of the high cost of the light sensitive material used for such resists, there has been the prpactice in the art to mix film forming resins with the light sensitive materials especially positive working materials to not only lower the cost of the resist, but to provide flexible films having more desirable physical properties. The film forming resins reduce the concentration of the light sensitive material in the light sensitive coating typically by as much as 50% or somewhat more and thereby reduce the cost of the light sensitive formulation. Typical film forming resins mixed with the light sensitive materials include polymers containing oxygen in the molecule, e.g. cellulose ethers such as ethyl or benzyl cellulose; polyvinyl esters such as polyvinyl acetate, polyvinyl acetobutyrate, polyvinyl butyrate and polyvinyl proprionate; or polyvinyl acetals such as polyvinyl formal or polyvinyl butyral. Mixtures of such resins may be used. Those advantagiously used primarily possess very high molecular weight, e.g., a polyvinyl acetate with an average molecular weight of from 500,000 to more than 2,000,000. These substances are usually mixed into the coating in quantities of from 0.01 to 2 parts by weight, typically from 0.5 to 1.5 parts by weight to each part by weight of diazo compound.

In the formation of resist coatings, it is also known to add alkali soluble novolak type phenolic or epoxy resins resistant to strong inorganic acids as listed in Karsten's (Lachrohstoff-Tabellene) Tables of Starting Materials for Lacquers, Second Edition, 1959, page 106 included herein by reference.

As noted above, the amount of resin added to the light sensitive coating typically ranges from about 0.05 to 1.5 parts by weight per part by weight of the light sensitive compound. Increase of the resin content in the prior art was considered undesirable as the ability to develop a light exposed light sensitive coating was impaired resulting in image patterns of poor image resolution. Consequently, though the cost of the light sensitive coating is reduced to some extent by the addition of a resin, this is at the sacrifice of image quality.

In commonly assigned, co-pending U.S. patent application Ser. No. 261,982 filed June 12, 1972, there is disclosed an improved light sensitive composition that has a substantially decreased content of light sensitive material, e.g. no more than 20% by weight of the total solids, typically between 2 and 20%, and preferably between 8 and 12%. The coating disclosed has excellent physical and chemical properties, at least comparable to prior art light sensitive compositions and in many instances, improved over prior art compositions. These new compositions comprise one or more positive working, light sensitive diazo compounds in combination with an acrylic resin and preferably a novolak resin. The acrylic resin contemplated in said application comprises the carboxyl type cross-linkable with epoxide groups, most preferably a terpolymer including acrylic acid as one monomer.

STATEMENT OF THE INVENTION

In accordance with the present invention, it has been discovered that the light sensitive compositions of the aforesaid U.S. patent application, Ser. No. 261,982 can be further improved by addition of a modifier to the acrylic resin, said modifier being an acrylamide, specifically an N-3-oxohydrocarbon substituted acrylamide, the ratio of the acrylic resin to the acrylamide modifier varying broadly from about 100:1 to 1:2 on a dried solids basis.

The addition of the acrylamide enhances photochemical properties of a film formed from said composition by decreasing exposure time and increasing developability by improving solvent differentiation between exposed and unexposed areas thereby providing an image of improved resolution, especially with regard to edge acuity of a developed image. This is true even at lower concentrations of light sensitive material. Moreover, the acrylamide renders the film of said resist more resistant to chemicals, especially acids, particularly when said resists have been baked subsequent to exposure. As an additional advantage, the addition of the acrylamide acts to decrease the overall viscosity of the liquid resist thereby permitting a higher solids content and a resultant thicker coating after application and drying.

From the above, the light sensitive compositions of the invention comprise one or more positive working, light sensitive diazo compounds in combination with a resin comprising an acrylic resin, an N-3-oxohydrocarbon substituted acrylamide modifier and preferably a novolak resin. The acrylic resin used is of the carboxyl type cross-linkable with epoxide groups, most preferably, a terpolymer including an acrylic acid as one monomer.

DESCRIPTION OF THE PREFERRED EMBODIMENTS

The acrylamide contemplated by the subject invention is an N-3-oxohydrocarbon substituted acrylamide preferably having the structural formula:

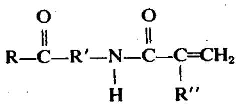

where R and R'' are each selected from the class consisting of hydrogen and lower alkyl radicals and R' is selected from the class consisting of ethylene and a lower alkyl-substituted ethylene radical.

The lower alkyl radicals are those containing no more than about 10 carbon atoms and include also the cycloalkyl radicals. They are exemplified by methyl, ethyl, propyl, isopropyl, butyl, sec-butyl, n-pentyl, cyclohexyl, cyclopentyl, isooctyl, n-decyl, and 4-ethyl-2-hexyl radicals. The radical R' is ethylene or an ethylene radical having at least one lower alkyl substituent on the carbon atom which is attached directly to the nitrogen atom of the acrylamide. For purposes of convenient reference, the two carbon atoms of the principal chain of the ethylene radical are designated numerically beginning from the nitrogen atom, i.e., the carbon atom attached directly to the nitrogen atom is designated as atom number 1 and the other as atom number 2. Thus, the R' radicals are illustrated by ethylene, 1-methyl-ethylene, 1,1-dimethyl ethylene, 1,1,2-trimethyl ethylene, 1-methyl-1-ethylene, 1-methyl-1-isobutyl ethylene, 1-ethyl-1-isopropyl ethylene, 1,1-diisopropyl ethylene, 1,2-dimethyl ethylene, 1-n-butyl-1-n-pentyl ethylene, 1-methyl-1-cyclohexyl ethylene, etc.

The radicall R'' is preferably a hydrogen radical. In some instances, it may be lower alkyl radical such as illustrated previously.

Specific examples of the N-3-oxohydrocarbon-substituted acrylamides include:

N-3-oxopropyl acrylamide
N-3-oxobutyl acrylamide
N-3-oxo-methyl-butyl acrylamide
N-3-oxo-1,1-dimethyl-butyl acrylamide
N-3-oxo-1-methyl-1,3-dicyclohexyl-propylacrylamide
N-3-oxo-1,2-dimethyl-1-ethyl-butylacrylamide
N-3-oxo-1,5-dimethyl-1-isopropyl-hexacrylamide
N-3-oxo-1,1-diisobutyl-2-isopropyl-5-methyl-hexyl acrylamide
N-3-oxo-1,1-dibutyl-2-n-propyl-heptyl acrylamide
N-3-oxo-1-methyl-butyl-alpha-methyl acrylamide The preferred acrylamide is the N-3-oxo-1,1-dimethylbutyl acrylamide.

The method of making the acrylamides is disclosed fully in U.S. Pat. No. 3,277,056 incorporated herein by reference.

The acrylic resins contemplated by the subject invention are the acrylic resins well known in the art and described in numerous publications including the *Modern Plastics Encyclopedia for 1968*, Volume 45, Number 14A, McGraw-Hill Publications, pages 136 to 138. In general, the acrylic resins are polymers or copolymers of acrylic acid, methacrylic acid, esters of these acids or acrylonitrile. The latter and the methyl and ethyl esters are the most frequently used starting materials. These colorless monomer liquid esters polymerize readily in the presence of light, heat or catalyst such as benzoyl peroxide to higher molecular weight polymers.

For purposes of the present invention, the resins known in the art as the carboxyl type cross-linkable with an expoxy resin are preferred. Resins identified in this matter are described in the publication *Acryloid Thermosetting Acrylic Resins*, Rohm and Haas Company, Philadelphia, Pennsylvania, August 1968. incorporated herein by reference.

The most preferred acrylic resins are terpolymers formed by the terpolymerization of three monomers illustrated by the combination of methyl acrylate, styrene and acrylic acid. These terpolymers contain carboxyl groups (—COOH) in the range of from about 3 to 15% by weight. This has been found to be a desirable range for both the terpolymer and some other acrylic resins contemplated by this invention since photoresists formulated with resins that contain in excess of 15% carboxyl groups have a tendency to be over-developed or have unsatisfactory etch resistance and with less than about 3% carboxyl groups, frequently incomplete development occurs.

As will be readily apparent from the above discussion, the key chemical moiety in the terpolymer resin appears to be the carboxyl grouping introduced by means of acrylic acid, methacrylic acid or maleic acid monomer. The ratio of the concentration of the other two monomers can be varied over a wide range. Furthermore, other monomers may be substituted for both the methyl acrylate and styrene without noticeable detrimental effects. For example, ethyl acrylate, propyl acrylate and the like may be used to replace the methyl acrylate monomer. With regard to the styrene monomer, other monomers such as p-methyl styrene, p-chlorostyrene, ethyl styrene and the like may be substituted without any resultant detrimental effects.

A preferred terpolymer for use in the composition is one which is comprised of about57.5% ethyl acrylate, 32.6% styrene and about 9.9% acrylic acid. A terpolymer of this type is commercially available from the Rohm and Haas Company under its tradename Acryloid AT-70.

The acrylic resins used in such formulations provide advantages including cost savings resulting from a decrease in the quantity of photosensitive material required. In addition, a photosensitive dry layer formed from such a formulation requires a substantially shorter exposure to light than a photosensitive layer of the prior art of the same thickness. Alternatively, thicker coatings may be formed from the photosensitive materials using said acrylic resins without increasing the required exposure time beyond that required for prior art photosensitive layers. Further, such photosensitive compositions provide photosensitive coatings having good film properties such as good flexibility, improved bonding to a substrate, excellent resistance to solvents and other chemicals, toughness, good dielectric properties and the like. The film properties are believed to be due in part to the decreased concentration of light sensitive materials which act as a contaminant with respect to film properties. A further advantage of the use of acrylic resins, particularly the preferred copolymers described above, is improved storage life prior to use.

By the addition of the acrylamide to the resin formulation comprising the acrylic resin, there are further improvements such as even greater resistance to chemicals, especially acids after post baking of a dry resist layer. Further, there is substantially improved edge acuity upon development of the photosensitive material thereby resulting in sharper images. Also, even thicker coatings can be obtained because the addition of the acrylamide decreases the viscosity of the coating composition at any given solids level thereby enabling a greater solids content and the resultant thicker coatings.

The reasons for the above advantages are not fully understood, but possibly relate to the fact that the acrylamides are known lubricants and thereby would be expected to decrease the viscosity of the coating composition and moreover, are known to cross-link in the presence of heat or irradiation, such cross-linking possibly resulting in improved chemical resistance.

the light sensitive composition may comprise solely the light sensitive material and the resin system comprising the acrylic resin and the acrylamide, but preferably comprises the light sensitive material in a resin system containing the acrylic resin and the acrylamide as key ingredients. However, other resins may be added to the resin system for specific known properties. Resins typically added to photoresists are the cellulose ethers, polyesters, polyvinyl alcohols, phenolics, polyvinyl acetals, phenol-formaldehyde resins, melamine-formaldehyde resins, styrene resins, epoxy resins, phenol-furfural resins, polyurethanes and the like.

In the most preferred embodiment of this invention, the resin system comprising the acrylic resin and the acrylamide is used in combination with a novolak resin such as a phenol-formaldehyde resin as this combination provides the most desirable properties. When used in combination with the novolak resin, the system of the acrylic resin and the acrylamide may be used in minor amounts even though it is the basic resin system in terms of the improved properties of the resist as described above.

For purposes of convenience, to define concentrations of various ingredients, the term "acrylics" or "acrylic resin" will be used to define the combination of the acrylic resin and the acrylamide while the term "resin system" will be used to define the system comprising all of the resins used in the formulation. Based upon the above, in combination with the novolak resin, the acrylics may be used in minor amounts even though this system is the key ingredient in the formulation. In this respect, the concentration of the novolak resin may vary from 1 to 90% by weight of the total resin system, but preferably varies from 25 to 75% by weight and most preferably ranges between 40 and 60% by weight of the resin system. It should be understood that other resins such as those noted above, plasticizers, dyes and the like in minor amounts, may be added to the resin system. Where the resin system comprises the acrylics and a secondary resin other than the novolak resin, the acrylics are preferably present in an amount in excess of 50% by weight of the resin system. The acrylics comprise the acrylic resin and the acrylamide. On a dry solids basis, the ratio of the acrylic resin to the acrylamide may vary broadly from about 100:1 parts acrylic resin to acrylamide to 1:2 parts acrylic to acrylamide, but preferably varies from about 50:1 to 1:1 and most preferably varies between about 25:1 and 10:1.

The light sensitive materials contemplated by the subject invention are the positive acting diazo compounds well known in the art. A concise though through discussion of these materials appears in *Light Sensitive Systems*, Kosar, John Wiley and Sons, incorporated, New York, 1965, pages 194 to 214 and 336 to 352, incorporated herein by reference.

Preferred for purposes of this invention are the light sensitive ortho-quinone diazides, especially the ortho-quinone diazide sulphonic acid esters represented by the following general formula:

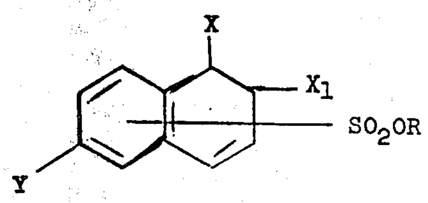

where X and $X_1$ are nitrogen or oxygen and are different from each other, Y is hydrogen or halogen and R is a substituted or unsubstituted aryl or hetereocyclic radical. Examples of materials conforming to the above general structure are set forth in U.S. Pat. No. 3,046,121 included herein by reference. Examples of other light sensitive materials within the scope of this invention are set forth in the aforesaid *Light Sensitive Systems* and in U.S. Pat. Nos. 3,046,118; 3,102,809; 3,106,465; 3,130,047; 3,130,048; 3,148,933; 3,061,430; 3,184,310; 3,188,210 and 3,201,239, all incorporated herein by reference.

It is a discovery of this invention that due to the use of the acrylamide modifier in combination with the acrylic resin, as described above, the concentration of the light sensitive material in the photoresist coating may be substantially reduced from the 50% by weight on a total dry solids basis such as in the prior art and in fact, such high concentration of light sensitive material is detrimental. In accordance with the preferred embodiment of the subject invention, the concentration of the light sensitive material, in terms of total dry solids constituting the light sensitive coating, does not exceed 20% by weight, may be as low as 2% by weight, and preferably varies from about 8 to 12% by weight, though it should be understood that amounts up to 40% by weight are operative.

The light sensitive formulations of this invention are used in conventional manner and are preferably applied to the substrate in the form of a solution containing the dissolved acrylics, the secondary resin if any and other additives such as plasticizers and the like, especially the novolak, and the light sensitive material. Coatings may be formed by whirl-coating, brushing or casting or in any other manner known to those skilled in the art. After application of the coating, it is dried, preferably in an oven, and dependent upon the acrylic resin used may be baked at mild temperatures of from about 150° to 200°F for a short time, typically less than 30 minutes to cure the polymer. It is then exposed for from 1 to 20 minutes depending upon the formulation of the light sensitive layer, its thickness and the intensity of the light source. Thereafter, it is developed by contact with a suitable developer for a period of from 1 to 10 minutes, again dependent upon the formulation of both the coating and developer, the film thickness and the like.

Where the light sensitive material is to be used as a photoresist, the metal support in the portion bared by the developer is treated with a suitable etching solution for a time sufficient to etch the metal base to the desired degree. After etching, the plate is rinsed and the remaining light sensitive coating is removed, if desired, for example, by treatment with an organic solvent as used in the preparation of the light sensitive coating.

Where the acrylics comprise the predominant amount of the resin system, prior art alkali developers are not suitable as they attack the exposed portions of the resist and are slow. A better developer comprises an aqueous solution of a compound containing both hydroxy and amine functionalities, such as the alkanolamines or solutions containing both amines and alcohols. Alkyl primary amines and polyhydroxy alcohols are preferred. The total active components in solution preferably comprise from about 2 to 25% by weight of the solution. A typical developer formulation would comprise from 5 to 25% by volume of ethanolamine in water. Where the resin system comprises a high proportion of the novolak resin, then the prior art alkali metal hydroxide developers may be used. Depending upon the ratio of the acrylic resin to the novolak resin, the alkali metal hydroxide can be used in conjunction with amine-hydroxide developers as would be obvious to those skilled in the art.

The invention will be better understood by reference to the following examples.

EXAMPLE 1

A solution is prepared comprising 100 ml of glycol monoethyl ether, 3.3 grams of a photosensitive compound believed to be the 2,3,5-naphthoquinone diazide sulphonic acid ester of p-coumyl phenol and 50.7 grams of an acrylic resin terpolymer identified as Acryloid AT-70 of Rohm and Haas Company. This acrylic resin is sold in the form of a solution of 50% resin in a xylene-cellulose acetate solvent. It has an acid equivalent of 875 and viscosity of about 1200 to 2500 cps at 25°C. The solution so formed is coated onto one side of a copper clad laminate by means of a plate-roller after which the coating is dried and cured by placing the laminate so formed in an oven maintained at about 200°F for about 10 minutes. The dried coating has a thickness of about 1.0 mil. The light sensitive layer of the photoresist is exposed to a light source comprising a 10 amp arc lamp for a period of about 12 minutes under a negative pattern or master. The exposed layer is developed by washing with an aqueous solution containing 5 grams of butylamine and 5 ml of dibutyl alcohol in 100 ml of water for about 3 minutes. The developed image is of good resolution.

EXAMPLE 2

The procedure of example 1 is repeated but the amount of the acrylic resin is decreased to 25.4 grams and an additional 25.4 grams of N-3-oxo-1,1-dimethylbutyl acrylamide are added. Following the coating and drying procedure, the dried coating has a thickness of about 1.2 mils. The light sensitive layer of the photoresist is exposed to the light source comprising the 10 amp arc lamp for a period of about 10 minutes under a negative pattern or master. The exposed layer is developed following the procedure of example 1 and the developed image is of image resolution improved over that of example 1.

EXAMPLE 3

The procedure of example 2 is repeated, but the acrylic resin is decreased to 20 grams and the acrylamide increased to 30.7 grams. Similar results were obtained, but the image was more difficult to develop.

EXAMPLE 4

The procedure of example 2 is repeated, but the amount of acrylic resin is reduced to 48 grams and 2.3 grams of the acrylamide are added. The dried coating has a thickness of about 1.2 mils and the developed image is of excellent resolution, superior to the resolution obtained in the foregoing examples 1 through 3.

EXAMPLE 5

The procedure of example 2 is repeated, but Acryloid AT-101 is substituted for the Acryloid AT-70. The Acryloid AT-101 was obtained from Rohm and Haas Company and is a carboxyl type, thermosetting acrylic resin believed to be essentially a homopolymer of methacrylic acid having a Brookfield viscosity of about 700 to 1300 cps at 25°C. Similar results are obtained.

EXAMPLE 6

Commercially available photoresist identified as GAF Photoresist Number 102 (a Product of General Aniline and Film Corporation believed to comprise about 1 part 3-diazo-2,4-diphenyl-3H-pyrolenine and about 3 parts of a mixture of vinyl acetate in a copolymer of vinyl acetate and crotonic acid in a ketone solvent) was mixed with the Acryloid AT-70 acrylic resin-acrylamide resin system of example 2. 3 parts by weight of the acrylic resin was added for each part of the GAF photoresist on a solids basis. Therefore, the total concentration of the diazo compound in the photoresist was 1 part by weight per 16 parts of photoresist solids.

The photoresist so prepared was coated onto a copper clad laminate by means of a plate-whirler, after which the coating was dried and cured by placing the laminate in an oven maintained at 150°F for about 15 minutes. The light sensitive layer of photoresist was then exposed to a light source comprising a 10 amp arc lamp for a period of about 5 minutes under a negative pattern or master. The exposed layer was developed with a solution containing 25% by volume ethanolamine. The photoresist was removed from the non-irradiated areas, but the photodecomposition products were left in tact within the irradiated portion in a sharp image pattern.

EXAMPLES 7 THROUGH 11

Five solutions were prepared, each in 200 ml of glycol monoethyl ether. The formulations were as follows:

| Ex. No. | Acrylic (1) System (gm) | Novolak (2) Resin (gm) | Photosensitizer (3) (gm) |
|---|---|---|---|
| 7 | 80 | 20 | 10 |
| 8 | 60 | 40 | 10 |
| 9 | 50 | 50 | 10 |
| 10 | 40 | 60 | 10 |
| 11 | 20 | 80 | 10 |

(1) A mixture of Acryloid AT-70 as described above and N-3-oxo-1,1-dimethylbutyl acrylamide in a weight ratio of 20:1.
(2) Alnovol 429K, an alkali soluble phenol formaldehyde novolak resin.
(3) The 2,1,5-naphthoquinone diazide sulphonic acid ester of p-coumyl phenol.

Each solution was coated onto one side of a copper clad laminate by means of a plate roller after which the coating was dried and cured by placing the laminate in an oven maintained at about 200°F for about 10 minutes. The dried coatings had thicknesses varying from about 1.5 to 2.2 mils. The light sensitive layers of photoresist were exposed to a light source comprising a 10 amp arc light for a period of about 3 minutes under a negative pattern or master. Examples 7 and 8 were developed with a 10% by volume solution of ethanolamine, examples 9 and 10 were developed with a 2% by weight solution of sodium hydroxide and example 11 was developed with a solution of ethanolamine containing sodium hydroxide. In all cases, developed images were of excellent image pattern. Edge acuity of the developed images were excellent and the resist patterns were etch resistant, flexible and otherwise possessed good properties.

If the acrylic resin system set forth in the above examples were substituted with simply the Acryloid AT-70 acrylic resin in the designated amount, thinner coatings would be obtained and the developed images would also be of excellent image resolution, but somewhat inferior to those of the aforesaid examples. Moreover, chemical resistance of the coatings to acids in particular, but also base, would be vastly superior to those resist coatings where the acrylamides were omitted.

EXAMPLE 12

The procedure of example 7 was repeated, but the acrylic resin content was reduced to 70 grams and 10 grams of a polyvinylmethyl ether substituted therefore. Similar results were obtained.

EXAMPLE 13

The procedure of example 7 was repeated, but N-3-oxopropyl acrylamide is substituted for the N-3-oxo-1,1-dimethylbutyl acrylamide. Similar results are obtained.

EXAMPLE 14

A photoresist formulation was prepared having the following composition:

| | |
|---|---|
| Photosensitizer (1) | 4 grams |
| acrylic resin system (1) | 70 grams |
| epoxy resin (2) | 30 grams |
| methyl cellulose acetate | 400 grams |

(1) Same as example 1.
(2) The epoxy resin was Epon 1001, a medium molecular weight polymer formed from epichlorohydrin and bisphenol A.

The photoresist was coated onto one side of a copper clad laminate by means of a plate-whirler and the coating was dried in an air circulating oven maintained at 150°F. The light sensitive layer was exposed to a negative image pattern through a light source comprising a 10 amp arc lamp for a period of about 6 minutes. The exposed laminate was developed with a developer comprising 5 grams of each of N-butyl amine and ethanol in 1 liter of water. The developed image was of excellent definition.

the photoresists of this invention find application for all purposes for which photoresists have heretofore been used and are particularly useful for dry film applications. In said dry film applications, photoresist layers are coated onto a backing, dried and subsequently transferred onto a suitable substrate. Transfer takes place by adhering the resist layer to a substrate and removing the backing layer by peeling it from the resist layer or dissolving it therefrom with a suitable solvent.

We claim:

1. A positive working photoresist composition comprising an ortho quinone diazide sulfonyl ester light sensitive compound, an acrylic terpolymer resin wherein one of the monomers of the terpolymer is selected from the group consisting of methyl acrylate, ethyl acrylate, and propyl acrylate, wherein a second monomer of the terpolymer is selected from the group consisting of p-methyl styrene, p-chlorostyrene, p-ethyl styrene and styrene, and the third monomer of the terpolymer is selected from the group consisting of acrylic acid, methacrylic acid, and maleic acid, wherein the weight percent of said third monomer is 3–15% by weight as based on the total weight of the monomers of said acrylic terpolymer resin, and an N-3-oxohydrocarbon substituted acrylamide, the ratio of said acrylic resin to said acrylamide being between 100:1 parts acrylic resin to acrylamide to 1:2 parts acrylic resin to acrylamide on a weight basis, and said light sensitive compound comprising up to 40% by weight of the photoresist composition on a dry solids basis, and said acrylamide being represented by the formula:

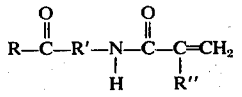

wherein R and R'' are each selected from the class consisting of hydrogen and lower alkyl radicals and R' is selected from the class consisting of ethylene and a lower alkyl-substituted ethylene radical.

2. The composition of claim 1 where the ratio of the acrylic terpolymer resin to the acrylamide varies between 50:1 and 1:1.

3. The composition of claim 1 where the ratio of the acrylic terpolymer resin to the acrylamide varies between 25:1 and 10:1.

4. The composition of claim 1 where the light sensitive therefor comprises from 2 to 20% by weight of the photoresist composition on a dry solids basis.

5. The composition of claim 1 where the light sensitive therefor comprises from 8 to 12% by weight of the photoresist composition on a dry solids basis.

6. The composition of claim 1 where R is methyl.

7. The composition of claim 1 where R is methyl and R'' is 1,1-dimethyl ethylene.

8. The composition of claim 1 including a novolak resin of the phenol-formaldehyde type present in an amount of from 25 to 75 % by weight of said resin system.

9. The composition of claim 8 where the novolak resin is present in an amount of from 40 to 60% by weight of said resin system.

* * * * *